United States Patent
Wang et al.

(10) Patent No.: US 7,564,096 B2
(45) Date of Patent: Jul. 21, 2009

(54) SCALABLE POWER FIELD EFFECT TRANSISTOR WITH IMPROVED HEAVY BODY STRUCTURE AND METHOD OF MANUFACTURE

(75) Inventors: Qi Wang, Sandy, UT (US); Ming-Huang Huang, Madison, WI (US); Joelle Sharp, Herriman, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/673,487

(22) Filed: Feb. 9, 2007

(65) Prior Publication Data

US 2008/0191248 A1    Aug. 14, 2008

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/22 | (2006.01) |
| H01L 33/00 | (2006.01) |

(52) U.S. Cl. ............... 257/330; 257/13; 257/14; 257/15; 257/16; 257/17; 257/18; 257/19; 257/20; 257/21; 257/22; 257/23; 257/24; 257/25; 257/95; 257/328; 257/329; 257/331; 257/332; 257/333; 257/334; 257/341; 257/401; 257/E29.127; 257/E29.128

(58) Field of Classification Search ............. 257/13–25, 257/95, 328–334, 341, 401, E29.127, E29.128
See application file for complete search history.

(56) References Cited

U.S. PATENT DOCUMENTS

| 5,366,914 A | 11/1994 | Takahashi et al. |
| 5,451,800 A | 9/1995 | Mohammad |

(Continued)

FOREIGN PATENT DOCUMENTS

| WO | 2006042040 | 4/2006 |
| WO | 2008027722 | 3/2008 |

OTHER PUBLICATIONS

King et al., "Electrical properties of heaily doped polycrystalline silicon-Germanium Films," *IEEE Transactions on electron devices*, 411:228 (1995).

(Continued)

*Primary Examiner*—Ida M Soward
(74) *Attorney, Agent, or Firm*—Townsend and Townsend and Crew LLP

(57) ABSTRACT

A field effect transistor (FET) includes a semiconductor region of a first conductivity type and a well region of a second conductivity type extending over the semiconductor region. A gate electrode is adjacent to but insulated from the well region, and a source region of the first conductivity type is in the well region. A heavy body region is in electrical contact with the well region, and includes a material having a lower energy gap than the well region.

38 Claims, 8 Drawing Sheets

U.S. PATENT DOCUMENTS

| | | | |
|---|---|---|---|
| 5,534,713 | A | 7/1996 | Ismail et al. |
| 6,020,600 | A | 2/2000 | Miyajima et al. |
| 6,200,866 | B1 | 3/2001 | Ma et al. |
| 6,239,463 | B1* | 5/2001 | Williams et al. ............ 257/328 |
| 6,255,692 | B1 | 7/2001 | Huang |
| 6,350,993 | B1 | 2/2002 | Chu et al. |
| 6,373,112 | B1 | 4/2002 | Murthy et al. |
| 6,531,748 | B2 | 3/2003 | Pfirsch |
| 6,700,180 | B2 | 3/2004 | Huang et al. |
| 6,709,912 | B1 | 3/2004 | Ang et al. |
| 6,885,084 | B2 | 4/2005 | Murthy |
| 6,887,760 | B2 | 5/2005 | Curro et al. |
| 6,927,454 | B2 | 8/2005 | Chan et al. |
| 7,205,627 | B2* | 4/2007 | Adkisson et al. ............ 257/463 |
| 2003/0146428 | A1 | 8/2003 | Ma et al. |
| 2004/0180485 | A1 | 9/2004 | Beasom |
| 2004/0256639 | A1 | 12/2004 | Ouyang et al. |
| 2005/0035400 | A1 | 2/2005 | Shirai et al. |
| 2005/0116217 | A1 | 6/2005 | Jones et al. |
| 2005/0167742 | A1 | 8/2005 | Challa et al. |
| 2006/0202249 | A1* | 9/2006 | Cheng et al. ................ 257/301 |
| 2007/0010052 | A1* | 1/2007 | Huang et al. ................ 438/199 |
| 2007/0108513 | A1 | 5/2007 | Rub et al. |
| 2007/0170549 | A1* | 7/2007 | Tsuzuki et al. .............. 257/565 |
| 2007/0190728 | A1* | 8/2007 | Sreekantham et al. ....... 438/270 |
| 2008/0116520 | A1* | 5/2008 | Grover ....................... 257/362 |
| 2008/0135931 | A1* | 6/2008 | Challa et al. ................ 257/331 |
| 2009/0008706 | A1* | 1/2009 | Yedinak et al. ............ 257/328 |

OTHER PUBLICATIONS

Ozturk et al., "Advanced $Si_{1-x}Ge_x$ Source/Drain and Contact Technologies for Sub-70 nm CMOS," *Tech Dig. IEDM*, p. 375 (2002).

Sze, S. M., pp. 297-307 from *Physics of Semiconductor Devices, 2hund Edition*, John Wiley & Sons, Inc. (1981).

Urdea et al., "Development of the Next Generation of Insulated Gate Bipolar Transistors based on Trench Technology," *ESSDERC'97*, Proceedings from conference of Sep. 22-24, 1997 in Stuttgart, Germany, pp. 504-507.

Wang et al., "Intersitical oxygen-related defects and current leakage in trench metal-oxide-semiconductorfield-effect transistor on epi/As++ structure," *J. Vac. Sci. Technol. A*, 24(4): (2006).

Ahoujja et al. "Electrical Properties of Boron-doped p-SiGeC Grown on n—Si Substrate," Applied Physics Letters, 77(9):1327-1329, Aug. 28, 2000.

Baliga, B.J., Power Semiconductor Devices, 3rd Edition, Cover Page and pp. 362-367, 1996.

Bouillon et al. "Search for the Optimal Channel Architecture for 0.18/0.12 um Bulk CMOS Experimental Study," IDEM Tech. Digest, 96:559-562, 1996.

Chang et al., "Suppression of Boron Penetration by Polycrystalline Si-x-yGexCy in Metal-Oxide-Semiconductor Structures," Applied Physics Letters, 74(17):2501-2503, Apr. 26, 1999.

Fischetti et al, "Band Structure, Deformation Potentials, and Carrier Mobility in Strained Si, Ge, and SiGe Alloys," J. Appl. Phys., 80(4):2234-2252, Aug. 15, 1996.

Huang et al., "Effect of Polysilicon Depletion on MOSFET I-V Characteristics," Electronics Letter, 29(13):1208-1209, Jun. 24, 2003.

PCT, International Search Report of The International Searching Authority for Application No. PCT/US2007-75911 Dated Feb. 25, 2008.

PCT, International Search Report of The International Searching Authority for Application No. PCT/US2005-036036 Dated Jan. 3, 2007.

Lang et al., "Measurement of the Band Cap of GexSix/Si Strained-Layer Heterostructures," Appl. Phys. Lett., 47(12):1333-1335, Dec. 15, 1985.

Langdo et al., "SiGe-Free Strained Si on Insulator by Wafer Bonding and Layer Transfer," Applied Physics Letters, 82(24):4256-4258, Jun. 16, 2003.

Lee et al., "Observation of Reduced Boron Penetration and Gate Depletion for PolySi0.8Ge0.2 Gated PMOS Devices," IEEE Electron Device Letters, 20(1):9-11, Jan. 1999.

Leitz et al., "Hole Mobility Enhancements in Strained Si/Si1-yGey p-Type Metal-Oxide-Semiconductor Field-Effect Transistors Grown on Relaxed Si1-xGex(x<y) Virtual Substrates," Applied Physics Letters, 79(25):4246-4248, Dec. 17, 2001.

Li et al., "Carrier Velocity-Field Characteristics and Alloy Scattering Potential in Si1-xGex/Si," Appl. Phys.Lett., 63(10):1393-1395, Sep. 5, 2003.

Office Action in U.S. Appl. No. 11/245,995 Dated Nov. 30, 2006.

Ricco et al., "Characterization of Polysilicon-Gate Depletion in MOS Structures," IEEE Electron Device Letters, 17(3):103-105, Mar. 1996.

Stewart et al., "Suppression of Baron Penetration in P-Channel MOSFETs Using Polycrystalline Si1-x-yGexCy Gate Layers," IEEE Electron Device Letters, 22(12):574-576, Dec. 21, 2001.

Sun et al., "Electron Mobility in Inversion and Accumulation Layers on Thermally Oxidized Silicon Surfaces," IEEE Trans. Electron Devices, vol. ED-27, 12 pages, 1980.

Sze, eds., Cover Page, Table of Contents and pp. 160-163 From Modern Semiconductor Device Physics, John Wiley & Sons, 1998.

Terauchi et al., "Suppression of the Floating-Body Effects in SOI MOSFETs by Bandgap Engineering," 1995 Symp. VLSI Tech. Digest of Technical Papers, pp. 35-36, 1995.

"The Profiling of Polycrystalline Silicon," Solecon Labs Technical Note, 2 pages.

Van De Walle et al., "Theoretical Calculations of Heterojunction Discontinuities in the Si/Ge System," Physical Review B, 34(8):5621-5634, Oct. 15, 1986.

PCT Written Opinion of The International Searching Authority for Application No. PCT/US2005/036036 Dated Jan. 3, 2007.

PCT Written Opinion of The International Searching Authority for Application No. PCT/US2007/75911 Dated Feb. 25, 2008.

PCT International Preliminary Report on Patentability For International Application No. PCT/US2005/036036 Dated Apr. 11, 2007.

Office Action in Related Chinese Application No. 200580034226.2 Dated Jun. 27, 2008.

Office Action in U.S. Appl. No. 11/469,456 Dated Mar. 17, 2008.

* cited by examiner

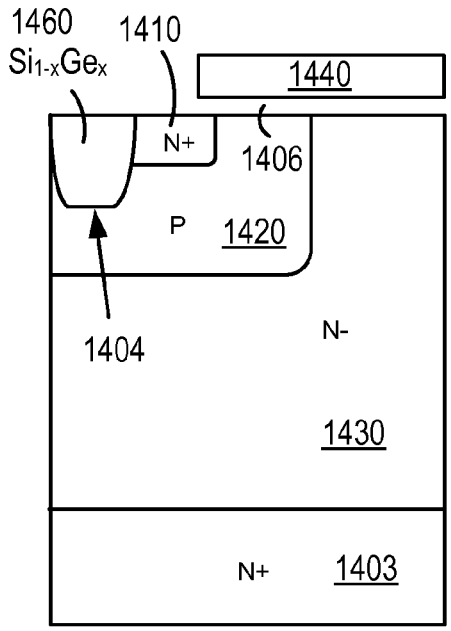
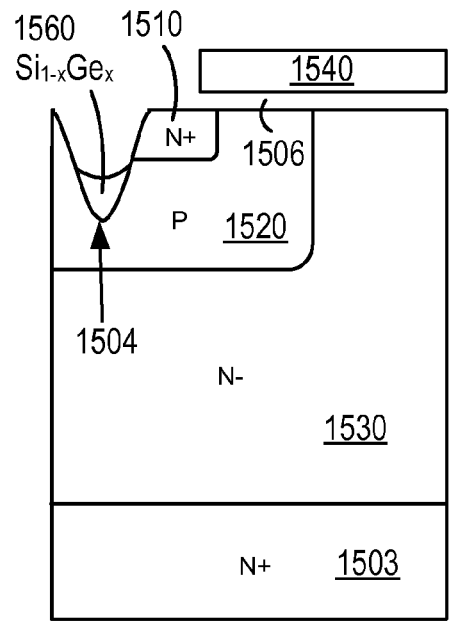
FIG. 14          FIG. 15
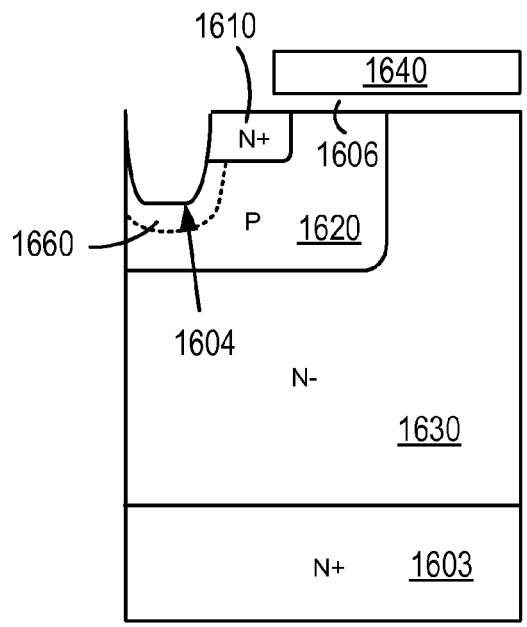
FIG. 16

SCALABLE POWER FIELD EFFECT TRANSISTOR WITH IMPROVED HEAVY BODY STRUCTURE AND METHOD OF MANUFACTURE

BACKGROUND OF THE INVENTION

The present invention relates generally to semiconductor power device technology, and more specifically to field effect transistors (FETs) with improved scalability and performance.

In order to achieve low cost manufacturing and high performance power transistors, the feature size of power transistors is continuously being reduced. One hurdle in shrinking the trench power field effect transistors (FETs) is the presence of the heavy body structure in the body region which is needed to ensure a robust unclamped inductive switching (UIS) performance. In one approach, heavy body recesses have been used to obtain a deeper heavy body structure. After the heavy body region is formed through the heavy body recess, a thin TiN barrier layer lining the heavy body trench is deposited. A thick Al metal film filling the heavy body trench is deposited using physical vapor deposition (PVD). PVD is used mainly because metal films deposited using PVD have high purity and thus low film resistance.

However, the continued shrinking of the cell pitch results in an increase in the aspect ratio of the heavy body recess which makes it difficult to properly fill the heavy body recess. PVD may no longer work to fill such high aspect ratio heavy body recesses because the overhang at the top corners of the heavy body recesses becomes more pronounced. As a result, the PVD film eventually closes up the recess and forms voids in the recesses which deteriorate the contact resistance and thus the UIS performance of the transistor. Chemical vapor deposition (CVD) of metal films is capable of resolving the problems caused by PVD, but the carbon contamination from the organo-metallic precursor in CVD processes causes a high film resistance, and a high temperature annealing is required for a good metal-silicon contact (silicidation).

Thus, there is a need for techniques which enable scaling of the transistor while providing improved performance.

BRIEF SUMMARY OF THE INVENTION

In accordance with an embodiment of the invention, a field effect transistor (FET) includes a semiconductor region of a first conductivity type and a well region of a second conductivity type extending over the semiconductor region. A gate electrode is adjacent to but insulated from the well region, and a source region of the first conductivity type is in the well region. A heavy body region is in electrical contact with the well region, and includes a material having a lower energy gap than the well region.

In one embodiment, the heavy body region comprises silicon germanium. In another embodiment, the heavy body region comprises boron doped silicon germanium. In yet another embodiment, the heavy body region comprises $Si_{1-x}Ge_x$ where $x>0.1$.

In another embodiment, a heavy body recess extends into and terminates within the well region adjacent the source region, and the heavy body region extends along a bottom of the heavy body recess. An interconnect layer extends into the heavy body recess to electrically contact the heavy body region and the source region.

In another embodiment, a heavy body recess extends into and terminates within the well region adjacent the source region, and the heavy body region at least partially fills the heavy body recess.

In still another embodiment, the gate electrode is disposed in a trench extending into the well region and terminates in the semiconductor region. In one variation, the trench further includes a thick bottom dielectric filling a bottom portion of the trench beneath the gate electrode, and a gate dielectric lining the trench sidewalls, where the gate dielectric is thinner than the thick bottom dielectric. In another variation, the trench further includes a shield electrode filling a lower portion of the trench beneath the gate electrode, the shield electrode being insulated from the semiconductor region by a shield dielectric. An inter-electrode dielectric layer extends between the shield electrode and the gate electrode, and a gate dielectric extends along upper trench sidewalls, where the gate dielectric is thinner than the shield dielectric.

In yet another embodiment, the gate electrode laterally extends over but is insulted from the well region by a layer of gate dielectric.

In accordance with another embodiment of the invention, a field effect transistor (FET) is formed as follows. A well region of a first conductivity type is formed in a semiconductor region of a second conductivity type. A gate electrode is formed adjacent to but insulated from the well region. A source region of the second conductivity type is formed in the well region. A heavy body recess is formed extending into and terminating within the well region adjacent the source region. The heavy body recess is at least partially filled with a heavy body material having a lower energy gap than the well region.

In one embodiment, the heavy body material comprises silicon germanium. In another embodiment, the heavy body material comprises boron doped silicon germanium.

In another embodiment, the heavy body recess is at least partially filled by forming a layer of SiGe using chemical vapor deposition, and etching the deposited layer of SiGe so that a top surface of the SiGe in the heavy body recess is substantially coplanar with a top surface of the source region. In yet another embodiment, boron is in-situ incorporated during SiGe deposition.

In yet another embodiment, the heavy body recess is at least partially filled by filling the heavy body recess with SiGe using selective deposition such that SiGe is formed over exposed silicon surfaces, and etching the SiGe so that a top surface of the SiGe in the heavy body recess is substantially coplanar with a top surface of the source region.

In yet another embodiment, the heavy body recess is substantially V-shaped and the heavy body recess is at least partially filled by forming a layer of SiGe using chemical vapor deposition, and etching to recess the layer of SiGe into the heavy body recess such that the SiGe does not overlap with the source region.

In still another embodiment, the heavy body recess is substantially V-shaped and heavy body recess is at least partially filled by filling the heavy body recess with SiGe using selective deposition such that a concentration of germanium in the SiGe decreases in a direction from the walls of the V-shaped heavy body recess toward a center of the heavy body recess. The SiGe is then etched using selective etching such that the SiGe remaining in the heavy body recess has a rounded upper surface.

In accordance with yet another embodiment of the invention, a field effect transistor (FET) is formed as follows. A well region of a first conductivity type is formed in a semiconductor region of a second conductivity type. A gate electrode is formed adjacent to but insulated from the well region.

A source region of the second conductivity type is formed in the well region. A heavy body recess is formed extending into and terminating within the well region adjacent the source region. A heavy body region is formed extending in the well region along a bottom of the heavy body recess. The heavy body region comprises a material having a lower energy gap than that of the well region.

In one embodiment, the heavy body region is formed by co-implanting boron and germanium into the heavy body recess to thereby form a boron doped silicon germanium region in the well region.

BRIEF DESCRIPTION OF THE DRAWINGS

FIGS. 14, 15, and 16 respectively show implementation of the techniques depicted in FIGS. 1C, 5C, and 7D in an otherwise conventional planar gate FET structure, in accordance with exemplary embodiments of the invention.

DETAILED DESCRIPTION OF THE INVENTION

Figure 1A:
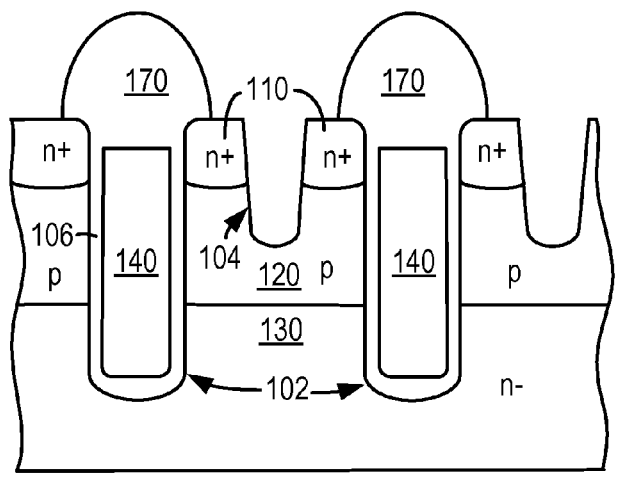
FIGS. 1A-1C are cross sectional views depicting process steps for forming a trench-gate FET with $Si_{1-x}Ge_x$ filled heavy body recesses according to an embodiment of the invention.

In accordance with embodiments of the invention, heavy body structures are formed using a heavily doped alloy of silicon germanium $Si_{1-x}Ge_x$, where x is the mole fraction of germanium in the alloy. In one embodiment, heavy body recesses are completely or partially filled by boron doped $Si_{1-x}Ge_x$ using CVD. In another embodiment, the resistance of the heavy body region is reduced by co-implanting Ge and B to form a heavily doped $Si_{1-x}Ge_x$ film in the body region along the bottom of the heavy body trench. Implant defects caused by this method may significantly reduce the carrier recombination lifetime at the well region, which can improve the UIS. For this second method, the contact resistivity ($\rho_c$) between metal and $Si_{1-x}Ge_x$ film is taken into consideration along with the $Si_{1-x}Ge_x$ film resistivity. The contact resistivity, $\rho_c$ can be expressed by the following equation (1):

$$\rho_c \propto \exp\left[\frac{2\sqrt{\varepsilon_s m^*}}{h} \frac{\phi_{Bn}}{\sqrt{N_D}}\right] \quad (1)$$

where $\varepsilon_s$, $m^*$, $h$, $\phi_{Bn}$, and $N_D$ are the permittivity of semiconductor, the electrical conducting effective mass, Planck's constant, the height of the metal-semiconductor barrier, and the impurity doping concentration, respectively.

Equation 1 shows that $\rho_c$ can be reduced by either increasing the doping concentration $N_D$ or decreasing the barrier height $\phi_{Bn}$. It has been reported that the maximum boron doping concentration in for example $Si_{0.5}Ge_{0.5}$ film, may be $1\times10^{21}$ cm$^{-3}$ or higher, and result in a contact resistivity $\rho_c$ near $10^{-8}$ Ω-cm$^2$, in comparison to the maximum boron doping concentration at $\sim2\times10^{20}$ cm$^{-3}$ in pure Si, and contact resistivity $\rho_c$ at $10^{-7}$ Ω-cm$^2$ only. In addition, Ge has a smaller energy band gap ($E_g$) than Si does. Accordingly, increasing the Ge content in the $Si_{1-x}Ge_x$ film yields a smaller energy gap $E_g$ and decreases barrier height $\phi_{Bn}$ ($\phi_{Bn}\sim\frac{1}{2} E_g$). As a result, the contact resistivity $\rho_c$ can be further reduced by increasing the Ge incorporation in the SiGe alloy.

Experimental results have shown that the film resistivity of for example poly $Si_{0.65}Ge_{0.35}$ can be as low as $\sim2.0$ mΩ-cm with a boron concentration of $1\times10^{19}$ cm$^{-3}$, as compared to $\sim7.5$ mΩ-cm of polysilicon at the same dopant level. Although this resistivity of poly $Si_{0.65}Ge_{0.35}$ is still one order larger than that of elemental Al (0.26 mΩ-cm), it is a significant improvement from polysilicon. The film resistivity may be decreased further by increasing the boron concentration (e.g., >$1\times10^{21}$ cm$^{-3}$) and the Ge incorporation (e.g., 50 atomic percentage) in the $Si_{1-x}Ge_x$ alloy. Low film resistivity of $Si_{1-x}Ge_x$ is important to both approaches.

Note that in this disclosure, "body region" and "well region" are used to refer to the same region and are thus interchangeable.

Figures 1B, 2:
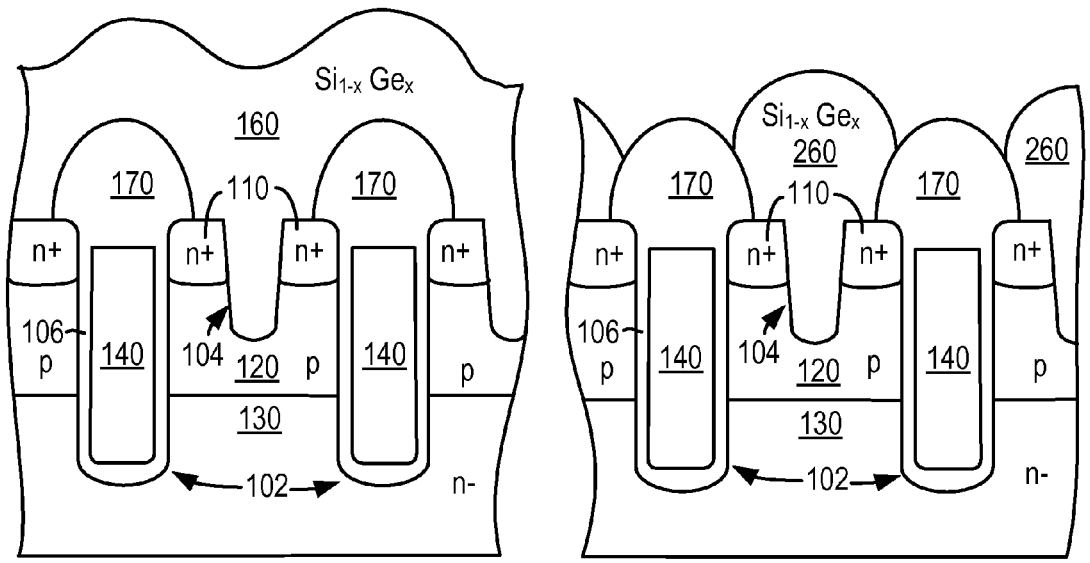
FIG. 2 is a cross sectional view showing a different technique for forming the $Si_{1-x}Ge_x$ material than that illustrated in FIG. 1B, in accordance with another embodiment of the invention.
Figure 1C:
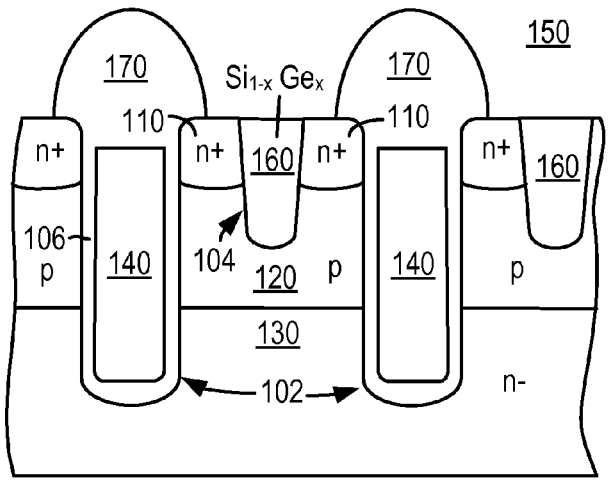

FIGS. 1A-1C show cross sectional views depicting process steps for forming a trench-gate FET according to an embodiment of the invention. In FIG. 1A, trenches 102 extending into an n-type semiconductor region 130, dielectric material 106 (e.g., oxide) lining the trench sidewalls and bottom, and gate electrode 140 recessed in each trench are all formed using known techniques. Body region 120 of p-type conductivity is formed in semiconductor region 130, and n-type source regions 110 are formed in body region 120 using conventional techniques. Heavy body recesses 104 extending deep into body region 120 are formed using known methods. Dielectric dome 170 (e.g., comprising BPSG) covering gate electrodes 140 and extending partially over source regions 110 are formed using conventional techniques. The sequence in which the trenches, the gate electrode, and various other layers, regions and recesses are formed may be changed in accordance with known processes.

In FIG. 1B, a layer of boron-doped $Si_{1-x}Ge_x$ 160 filling heavy body recesses 104 and extending over dielectric domes 170 is blanket deposited using chemical vapor deposition (CVD). Using CVD to deposit the boron-doped $Si_{1-x}Ge_x$ film 160 provides several advantages. First, unlike physical vapor deposition (PVD), CVD provides improved step coverage which enables proper filling (e.g., without any voids) of high aspect ration recesses and trenches. This in turn allows the cell pitch to be reduced, or for the same cell pitch a deeper heavy body recess can be formed which improves the UIS.

Second, a heavily boron-doped $Si_{1-x}Ge_x$ film (e.g., where x>0.5) has a lower resistivity than silicon with the same doping level, thus a low resistance heavy body region is formed. Third, CVD allows in-situ boron doping, which eliminates the need for a high temperature post-deposition anneal. Fourth, a very high boron concentration can be incorporated into the $Si_{1-x}Ge_x$ film. Moreover, boron is similar to carbon in a SiGeC alloy for its effects in compensating for lattice misfit strains, and accordingly yields higher dopant activation.

In FIG. 1C, boron-doped $Si_{1-x}Ge_x$ layer 160 is etched down to the mesa, so that its top surface in heavy body recesses 104 is substantially coplanar with the top surface of mesa regions. In one embodiment, a conventional selective plasma etch is used to etch $Si_{1-x}Ge_x$ layer 160. Selective etch of $Si_{1-x}Ge_x$ is possible because of its high selectivity to silicon. Increasing the Ge concentration in $Si_{1-x}Ge_x$ further increases the selectivity of $Si_{1-x}Ge_x$. The remaining process steps for completing the structure are carried out in accordance with conventional techniques. These steps include forming a top-side interconnect (e.g., comprising metal) contacting source regions 110 and heavy body regions 160.

FIG. 2 is a cross sectional view showing a different technique for forming the $Si_{1-x}Ge_x$ material than that illustrated in FIG. 1B, in accordance with another embodiment of the invention. In FIG. 2, the boron-doped $Si_{1-x}Ge_x$ material 260 is selectively deposited. Because of the high selectivity between dielectric (such as BPSG 170) and silicon, during the deposition, boron-doped $Si_{1-x}Ge_x$ material 260 forms over exposed surfaces of body region 120 and exposed surfaces of source regions 110. The same selective etch depicted by FIG. 1C can then carried out to etch back the selectively deposited boron-doped $Si_{1-x}Ge_x$ material 260. Advantageously, neither the blanket CVD technique (FIG. 1B) nor the selective deposition technique (FIG. 2) requires a mask.

In some exemplary embodiments, $Si_{1-x}Ge_x$ with 0.1<x<0.3 is used. However, other embodiments of the invention can include a Ge content of less than or equal to 10 atomic percentage, or greater than or equal to 30 atomic percentage. If the Ge content in Si is very high, such as greater than 80 atomic percentage, the energy gap of the alloy would be more like that of Ge. A polysilicon $Si_{1-x}Ge_x$ layer can take such a large percentage of Ge, i.e., 80 atomic percentage or higher. An epitaxial $Si_{1-x}Ge_x$ layer, however, has a limit to incorporating Ge in the Si since the larger lattice constant of Ge mismatches that of Si, and would thus strain the lattice or cause dislocations to form.

FIGS. 3A-3C and FIG. 4 show cross sectional views depicting process steps for forming a trench-gate FET according to two other embodiments of the invention. The process sequences depicted by FIGS. 3A-3C and FIG. 4 are respectively similar to the process sequences depicted by FIGS. 1A-1C and FIG. 2, except that in FIGS. 3A-3C and FIG. 4 dielectric material 370 over gate electrode 340 is substantially coplanar with the mesa surface. This results in formation of a FET structure with self-aligned features and a planar top surface.

Figure 3A:
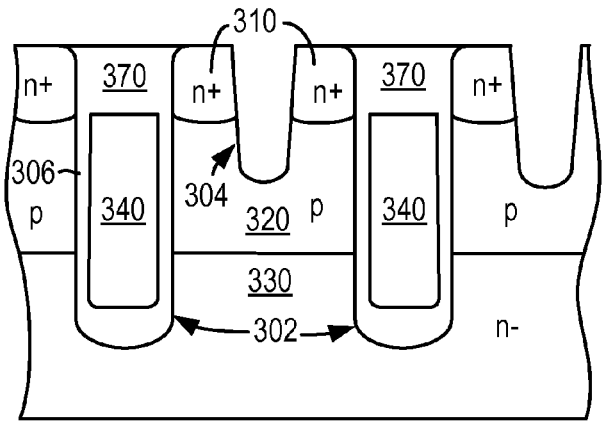
FIGS. 3A-3C are cross sectional views depicting process steps for forming a trench-gate FET with $Si_{1-x}Ge_x$ filled heavy body recesses according to yet another embodiment of the invention.
Figure 3B:
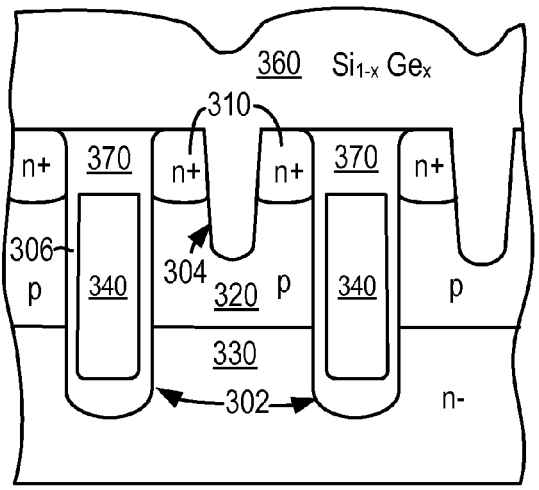
Figure 4:
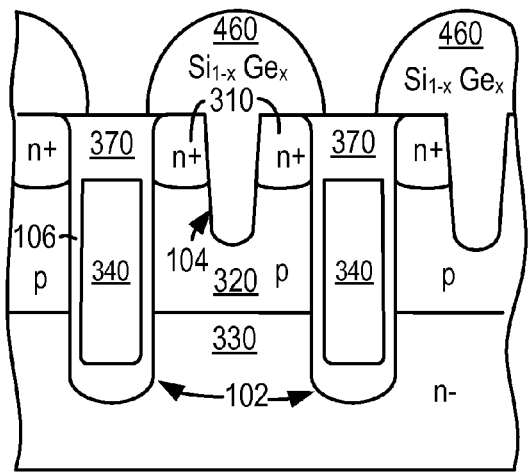
FIG. 4 is a cross sectional view showing a different technique for forming the $Si_{1-x}Ge_x$ material than that illustrated in FIG. 3B, in accordance with another embodiment of the invention.
Figure 3C:
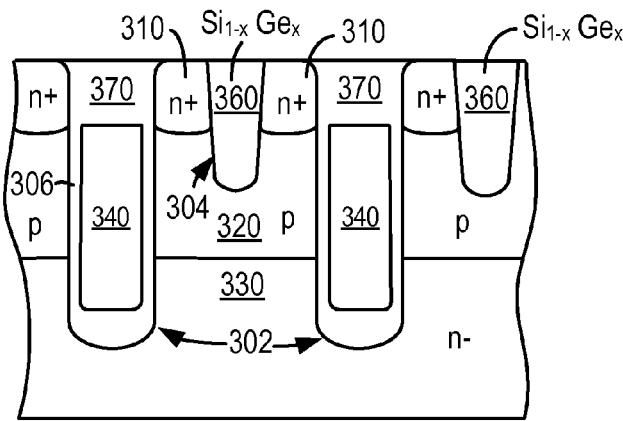

Unlike the embodiment depicted by FIG. 1A wherein forming dielectric dome 170 requires a mask, in FIG. 3A, forming dielectric material 370 over gate electrode 340 does not require a mask. In one embodiment, dielectric material 370 is formed by first depositing a layer of dielectric material (e.g., BPSG) over the structure and subsequently etching it down to the mesa surface. A conventional dielectric etch process that is selective to silicon can be used. Source regions 310 may be formed by a conventional blanket implant in the active region prior to forming heavy body recesses 304. The process steps depicted by FIGS. 3B-3C and FIG. 4 are similar to those in FIGS. 1B-1C and FIG. 2, respectively, and thus will not be described. However, as can be seen in FIG. 3C, a structure with a substantially planar top surface is obtained over which an interconnect layer (not shown) may be formed. Thus all the advantages associated with forming a planar device, including excellent step coverage, is attained.

Figure 5A:
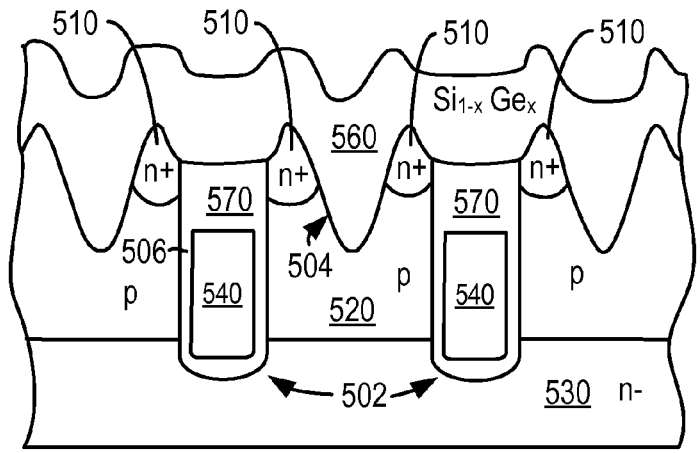
FIGS. 5A-5C are cross sectional views depicting process steps for forming a trench-gate FET with heavy body recesses having $Si_{1-x}Ge_x$ material therein, according to still another embodiment of the invention.
Figure 6A:
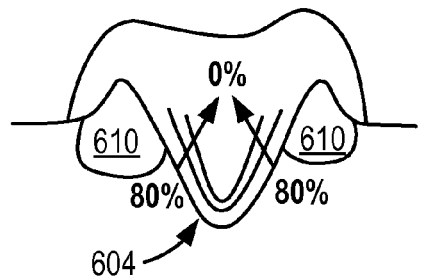
FIGS. 6A-6B are cross sectional views showing a different technique for forming the $Si_{1-x}Ge_x$ material than that illustrated in FIGS. 5A-5B, in accordance with another embodiment of the invention.
Figure 5B:
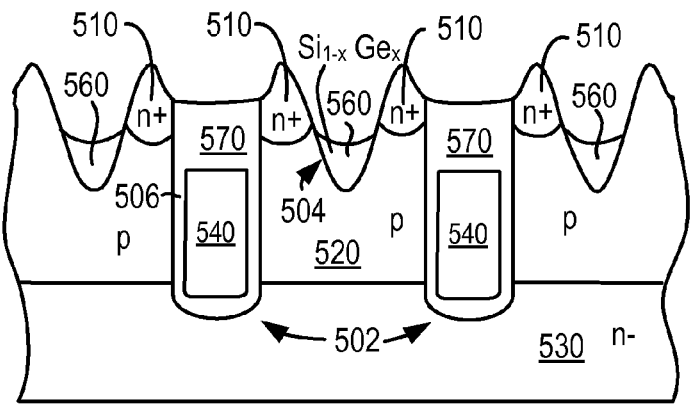
Figure 6B:
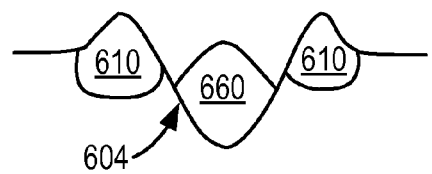

FIGS. 5A-5C and FIGS. 6A-6B are cross sectional views depicting two process sequences for forming a trench FET in accordance with yet other embodiments of the invention. FIGS. 6A and 6B show an enlarged view of only the immediate surroundings of the heavy body recess. In FIG. 5A, trenches 502 extending into n-type semiconductor region 530, dielectric material 506 (e.g., oxide) lining the trench sidewalls and bottom, and gate electrode 540 recessed in each trench are all formed using known techniques. Body region 520 of p-type conductivity is formed in semiconductor region 530, and n-type source regions 510 are formed in body region 520 using conventional techniques. V-shaped heavy body recesses 504 extending deep into body region 520 are formed using known methods. Dielectric cap 570 (e.g., comprising BPSG) filling upper portions of trenches 502 over gate electrodes 540 are formed using conventional techniques. The above sequence in which the trenches, the various semiconductor regions and recesses are formed may be changed in accordance with known processes.

In FIG. 5A, a layer of boron-doped $Si_{1-x}Ge_x$ 560 filling heavy body recesses 504 and extending over dielectric caps 370 is blanket deposited using chemical vapor deposition (CVD). Advantages of a blanket deposition using CVD to form the boron-doped $Si_{1-x}Ge_x$ film, instead of conventional PVD techniques are stated above. The blanket deposition of boron-doped $Si_{1-x}Ge_x$ results in formation of a layer of boron-doped $Si_{1-x}Ge_x$ with a substantially constant concentration of Ge. In the alternate process embodiment depicted by FIGS. 6A and 6B however, boron-doped $Si_{1-x}Ge_x$ material is formed using selective deposition such that the deposited boron-doped $Si_{1-x}Ge_x$ material has a graded Ge concentration. That is, the Ge content in the deposited boron-doped $Si_{1-x}Ge_x$ gradually decreases from a high value (e.g., about 80 atomic percentage) along the slanted surfaces of heavy body recesses 604 to a low value (e.g., about 0 atomic percentage) at the top center of the deposited boron-doped $Si_{1-x}Ge_x$ material. This is illustrated by the arrows in FIG. 6A. Accordingly, above the point where the Ge content of the deposited material becomes 0 atomic percentage, either polysilicon is formed in the case of the deposited material being poly $Si_{1-x}Ge_x$, or silicon is formed in the case of the deposited material being epitaxial $Si_{1-x}Ge_x$.

In FIG. 6B, as in FIG. 5B, the deposited $Si_{1-x}Ge_x$ material is selectively etched back. The remaining $Si_{1-x}Ge_x$ material 560 in FIG. 5C has a slightly bowl-shaped surface profile because the substantially constant concentration of Ge results in uniform etch back of the deposited $Si_{1-x}Ge_x$ material. In contrast, in FIG. 6B, the $Si_{1-x}Ge_x$ material 660 that remains after the selective etch back has a hill-shaped surface profile because the graded Ge concentration results in varying etch rates. Those portions of the deposited $Si_{1-x}Ge_x$ material along the slanted walls of V-shaped recesses 604 which have a higher concentration of Ge etch at a faster rate than the portions along the center of the deposited $Si_{1-x}Ge_x$ material which have a lower concentration of Ge. Because the etch rate varies with Ge content in the $Si_{1-x}Ge_x$ film, varying the Ge concentration enables formation of unique heavy body structures. For example, the hill-shaped surface profile of $Si_{1-x}Ge_x$ material 660 in FIG. 6B advantageously provides a larger surface area for interconnect contact than does the surface profile of $Si_{1-x}Ge_x$ material 560 in FIG. 5B.

Figure 5C:
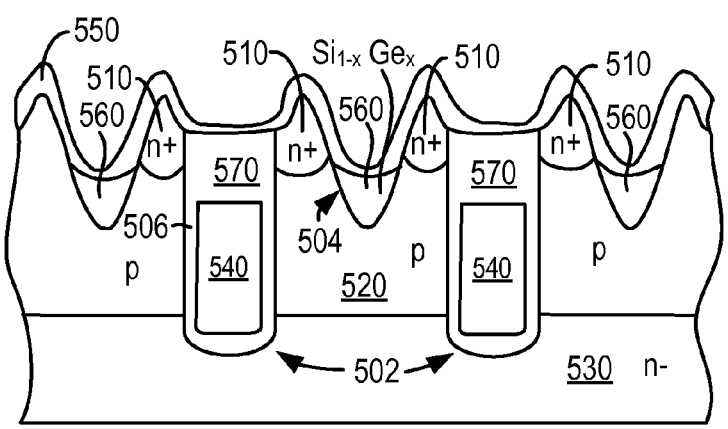

As can be seen in both FIGS. 5B and 6B, the deposited $Si_{1-x}Ge_x$ film is sufficiently etched back so that the remaining $Si_{1-x}Ge_x$ film does not form a junction with the source regions. This helps expose as much of the source surfaces as possible to reduce source contact resistance. In FIG. 5C, an interconnect layer 550 (e.g., comprising metal) is formed using, for example, PVD. Interconnect layer 550 electrically contacts source regions 510 and heavy body regions 560 inside V-shaped recesses 504.

Figure 7A:
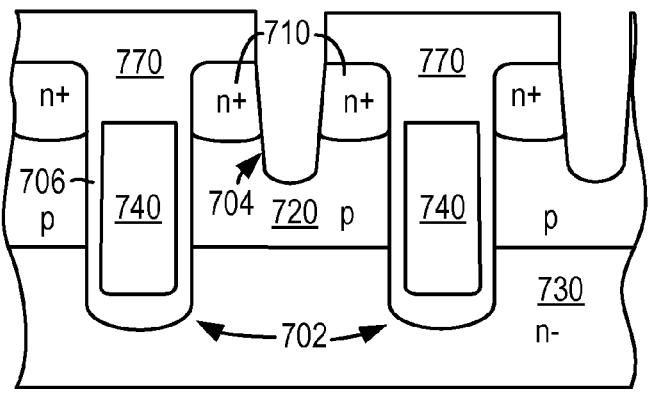
FIGS. 7A-7D are cross sectional views depicting a process sequence for forming a SiGeB region in the body region along the bottom of heavy body recesses in a trench FET in accordance with another embodiment of the invention.

FIGS. 7A-7D are cross sectional views depicting a process sequence for forming a SiGeB region in the body region along the bottom of heavy body recesses in a trench FET in accordance with another embodiment of the invention. In FIG. 7A, trenches 702 extending into n-type semiconductor region 730, dielectric material 706 (e.g., oxide) lining the trench sidewalls and bottom, and gate electrode 740 recessed in each trench are all formed using known techniques. Body region 720 of p-type conductivity is formed in semiconductor region 730 using conventional implant and drive-in techniques. A blanket source implant in the active region is carried out to form n+ regions extending between trenches in body region 720. A dielectric layer 770 (e.g., comprising BPSG) is formed and re-flowed, filling trenches over gate electrodes 740 and extending over implanted n+ regions. Dielectric layer 770 and the mesa are then recessed to form heavy body recesses 704 extending through the n+ regions and terminating deep in body region 702, using known techniques. Remaining portions of n+ regions form sources 710.

Figure 7B:
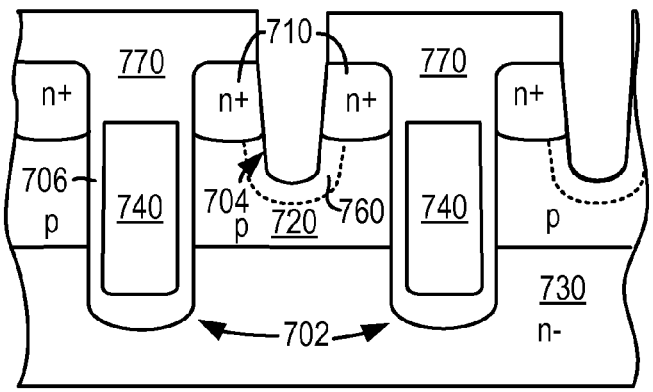
Figure 7C:
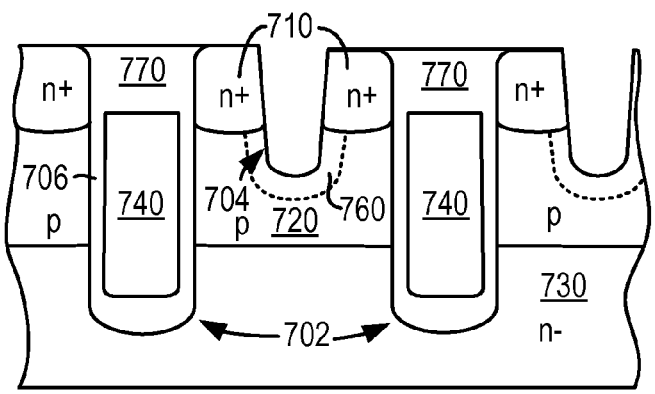
Figure 7D:
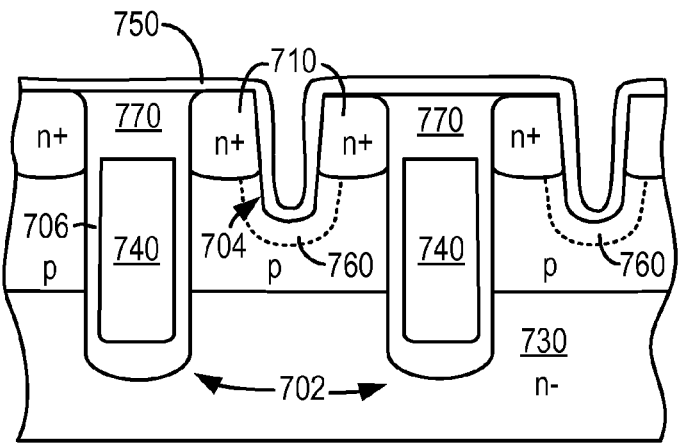

In FIG. 7B, with dielectric material 770 blocking gate electrodes 740 and sources 710, germanium and boron are co-implanted to form a layer of SiGeB 760 along the bottom of heavy body recesses 704. The implant energy and dose will determine the thickness and concentration of Ge in the SiGe layer. For example, Ge implant energy in the range of 50-300 KeV and implant dose in the range of $1\times10^{13}$ to $1\times10^{17}$ $cm^{-2}$ may be used. In FIG. 7C, dielectric material 770 is etched back (e.g., using conventional CMP techniques) so that its surface becomes substantially coplanar with the surface of the mesa. This exposes top surfaces of source regions for contact purposes. In the step of FIG. 7D, an interconnect layer 750 is formed electrically contacting source regions 710 and heavy body regions 760 inside heavy body recesses 704. In one embodiment, a thin barrier layer 710 such as titanium nitride (TiN) is formed lining all surfaces and walls of the recesses, followed by a thick layer of aluminum (e.g., using PVD) to fill heavy body recesses 704.

Co-implanting the bottom of heavy body recesses 704 with germanium and boron ensures an ohmic contact between the interconnect layer and body region 720. In accordance with other embodiments of the invention, a similar co-implant of germanium and boron is carried out to form a SiGeB region in the body region along the bottom of heavy body recesses in the embodiments shown in FIGS. 1A-1C, 2, 3A-3C, 4, 5A-4C, and 6A-6B. That is, in these embodiments, after SiGeB region is formed along the bottom of the heavy body recesses, the heavy body recesses may then be partially or substantially filled with doped $Si_{1-x}Ge_x$ material.

Figure 8:
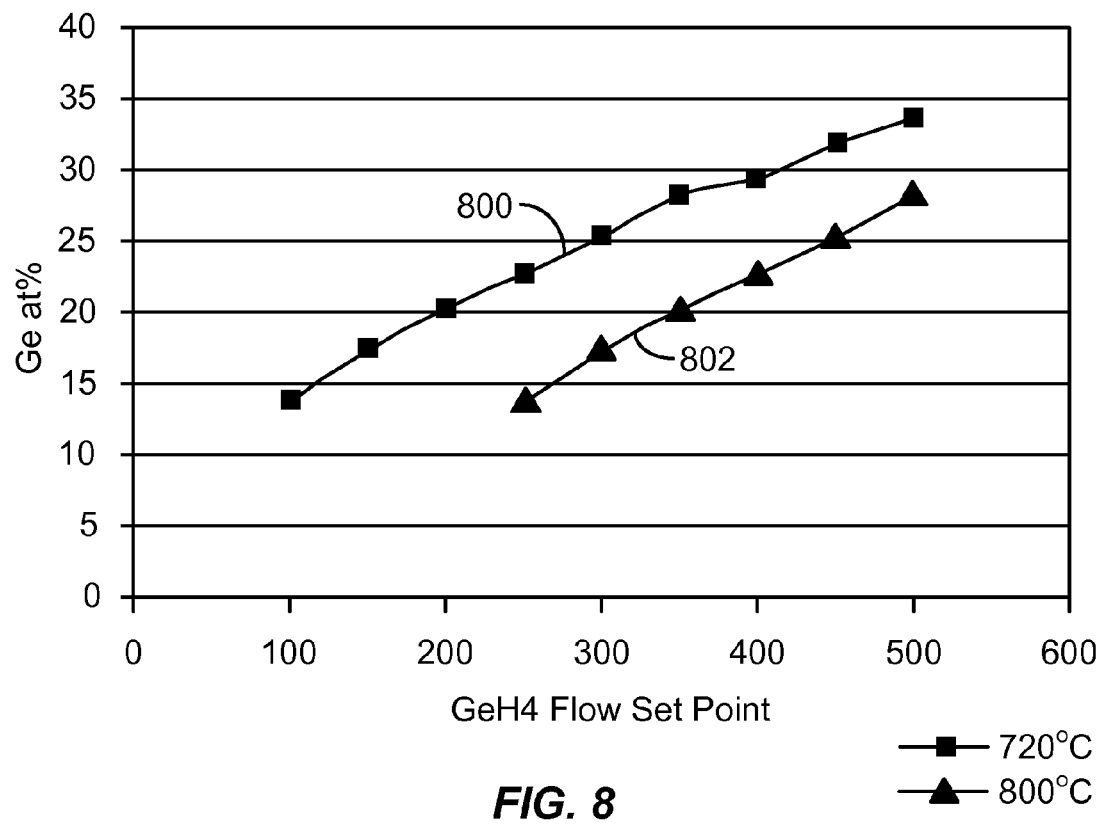
FIGS. 8 and 9 are graphs showing the process feasibility for $Si_{1-x}Ge_x$ deposition used in embodiments of the invention.
Figure 9:
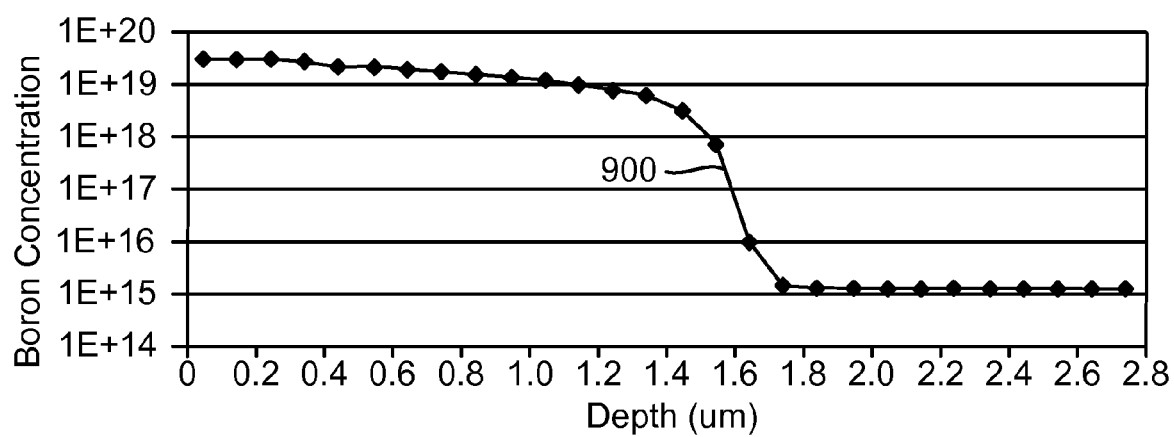

FIGS. 8 and 9 are graphs showing the process feasibility for $Si_{1-x}Ge_x$ deposition. In FIG. 8, lines 800 and 802 show the concentration of germanium versus GeH4 flow at exemplary process temperatures of 720° C. and 800° C., respectively. The results show that within the range of acceptable process temperatures, the incorporation of Ge in a $Si_{1-x}Ge_x$ film is enhanced at lower process temperatures. For example, data collected from a 720° C., reduced pressure (10 torr) $Si_{1-x}Ge_x$ process revealed as much as an 8.87 atomic percentage greater Ge content than an 800° C. process.

FIG. 9 shows the concentration of p-type dopant boron versus depth in a $Si_{1-x}Ge_x$ film deposited using a pressure of 10 torr, temperature of 700° C. and a flow rate of 300 cc with a germanium source gas (98% mix of $GeH_4$/hydrogen) and dichlorosilane as a precursor. The data points in FIG. 9 show that a concentration of greater than $1\times10^{19}/cm^3$ is obtained for depths less than about 1 µm.

Figure 10:
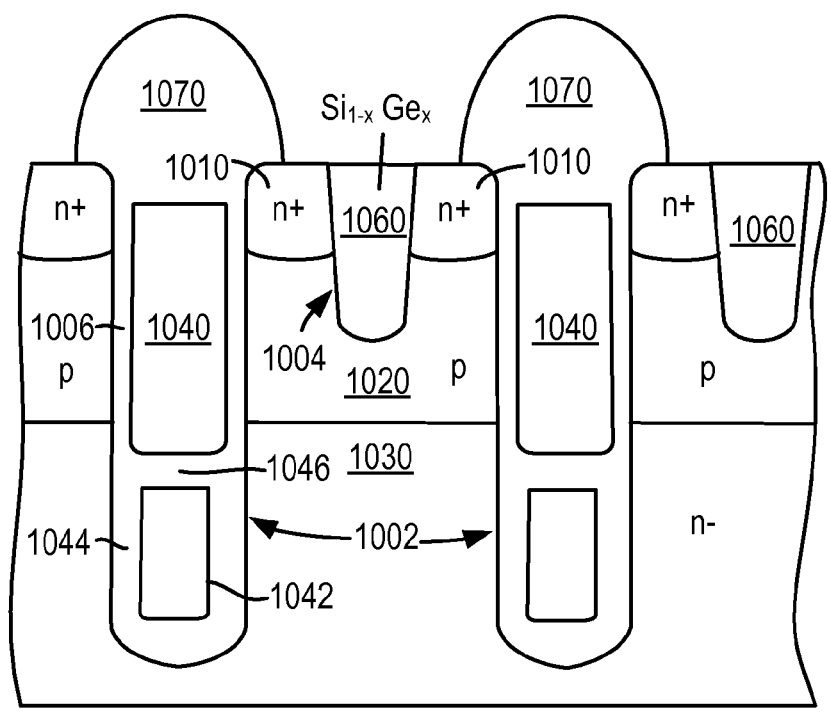
FIGS. 10, 11, 12, and 13 respectively show implementation of the techniques depicted in FIGS. 1C, 3C, 5C, and 7D in an otherwise conventional shielded gate FET structure, in accordance with exemplary embodiments of the invention.

FIGS. 10, 11, 12, and 13 respectively show implementation of the techniques depicted in FIGS. 1C, 3C, 5C, and 7D in an otherwise conventional shielded gate FET structure, in accordance with exemplary embodiments of the invention. FIG. 10 is a shielded gate variation of the structure in FIG. 1C. In FIG. 10, trenches 1002 extend deeper into drift region 103, and each trench includes a shield electrode 1042 in a bottom portion of the trench. Each shield electrode 1042 is insulated from drift region 103 by a shield dielectric layer 1044 (e.g., comprising oxide) lining the lower sidewalls and bottom of each trench 1002. Shield dielectric layer 1044 and shield electrodes 1042 may be formed using conventional techniques.

A gate electrode 1040 is formed over shield electrode 1042 in each trench. Gate electrode 1040 and shield electrode 1042 are insulated from one another by an inter-electrode dielectric layer 1046. The upper trench sidewalls are lined with a gate dielectric layer 1006 (e.g., gate oxide). In one embodiment, both the shield dielectric layer 1044 and inter-electrode dielectric layer 1046 are thicker than gate dielectric layer 1006. In another embodiment, gate dielectric layer 1006 and inter-electrode dielectric 1046 are formed at the same time, and are thus of the same thickness.

All remaining regions and layers of the structure in FIG. 10 (e.g., body region 1020, source regions 1010, heavy body recess 1004 and $Si_{1-x}Ge_x$ 1060 filling recesses 1004, and dielectric domes 1070) are formed in a similar manner to those depicted by FIGS. 1A-1C, and thus the same considerations, variations, features and advantages described above in reference to FIGS. 1A-1C also apply to the shielded gate structure in FIG. 10.

Figure 11:
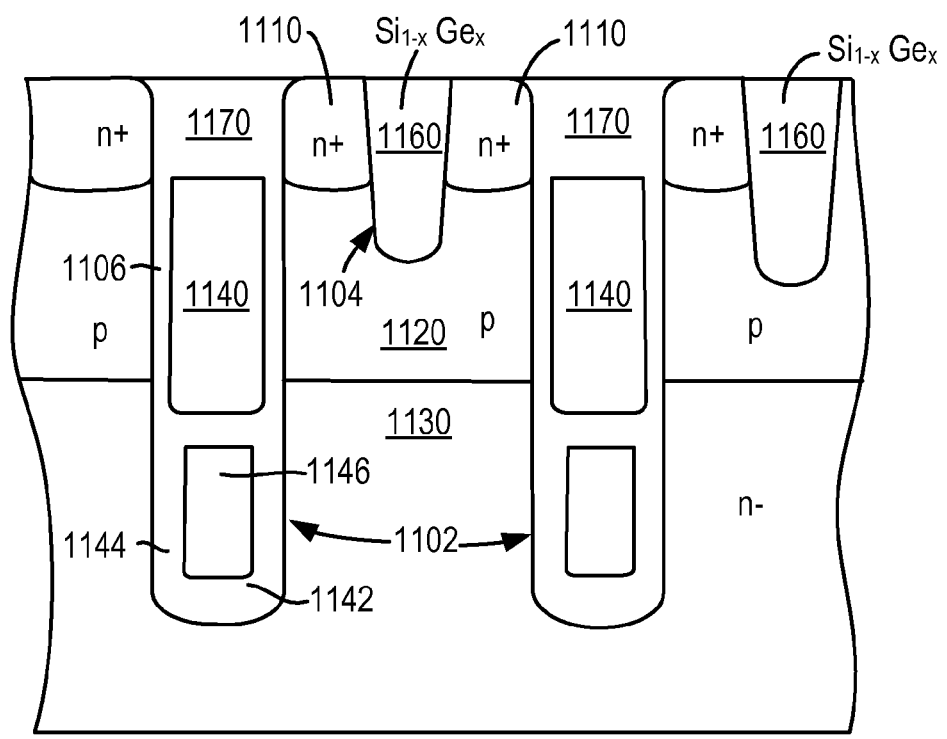
Figure 12:
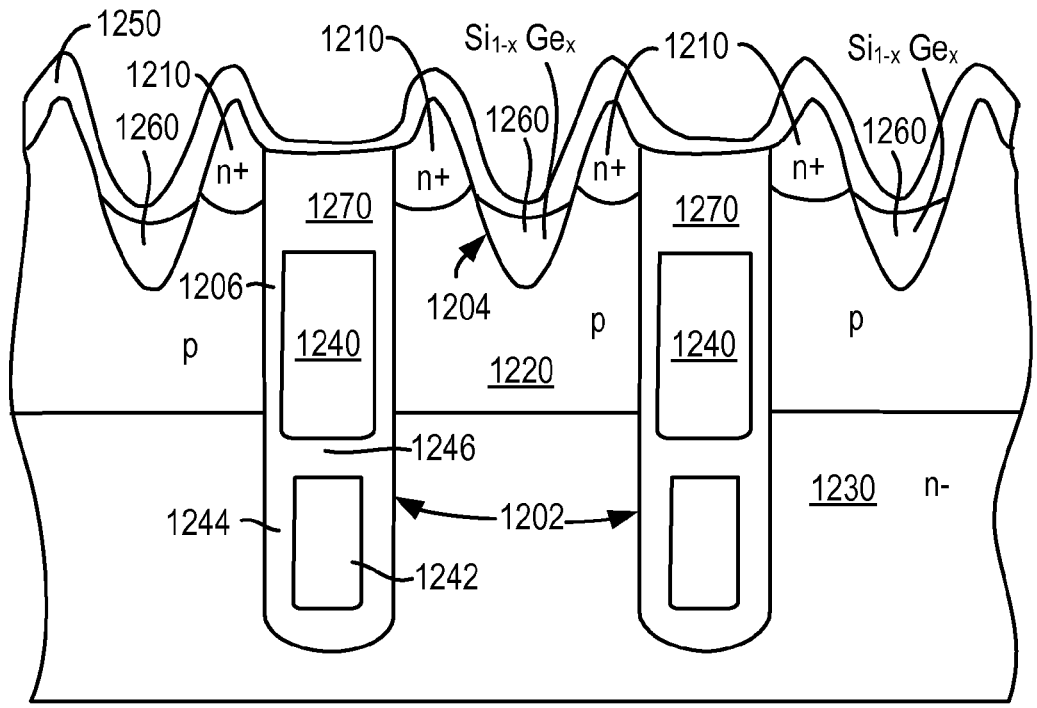
Figure 13:
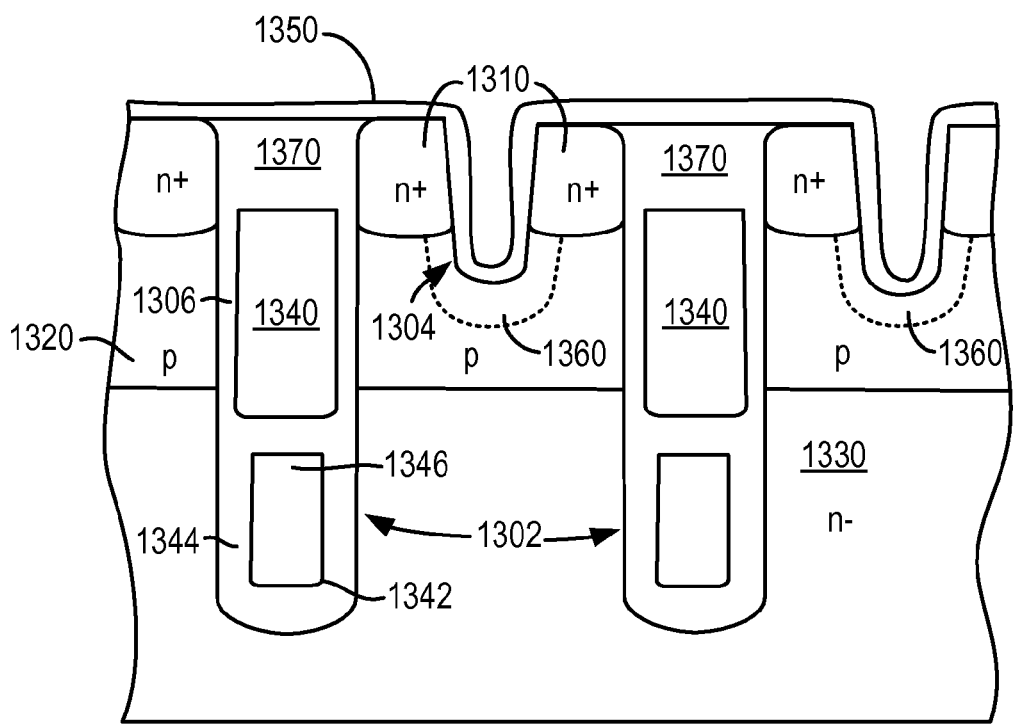

FIGS. 11, 12 and 13 are shielded gate variations of the structures in FIGS. 3C, 5C and 7D, respectively. In each of FIGS. 11-13, the trench structure and its inner material are similar to those in FIG. 10 and thus will not be described. Also, the remaining regions and layers of the structures in FIGS. 11, 12, and 13 are formed in a similar manner to those depicted by FIGS. 3A-3C, 5A-5C, and 7A-7D, respectively. Thus the same considerations, variations, features and advantages described above in reference to FIGS. 3A-3C, 5A-5C, and 7A-7D also apply to the shielded gate structures in FIGS. 11, 12 and 13, respectively.

FIGS. 14, 15 and 16 respectively show the various implementations of the $Si_{1-x}Ge_x$ heavy body depicted by FIGS. 1C/3C, 5C and 7D in an otherwise conventional planar gate FET structure, in accordance with exemplary embodiments of the invention. In FIG. 14, gate electrode 1440 laterally extends over well region 1420, drift region 1530 and overlaps source region 1410. A gate dielectric 1406 (e.g., gate oxide) insulates gate electrode 1440 from its underlying regions. The surface portion of well region 1420 extending directly under gate electrode 1440 between source region 1410 and drift region 1430 forms the channel region. Highly doped n-type region 1403 forms the drain contact region.

Body region 1420, source region 1410, gate electrode 1540, gate dielectric 1460, heavy body recess 1404 are all formed using conventional process techniques. $Si_{1-x}Ge_x$ 1460 filling recess 1404 may be formed either using blanket deposition (similar to that depicted by FIGS. 1B, 3B) or using selective deposition (similar to that depicted by FIGS. 2, 4), followed by selective etch (similar to that depicted by FIGS. 1C, 3C). Thus, the same considerations, variations, features and advantages described above in reference to FIGS. 1-4 may also apply to the planar gate structure in FIG. 14.

FIGS. 15 and 16 are planar gate variations of the structures in FIGS. 5C and 7D, respectively. In each of FIGS. 15-16, the gate electrode and its underlying gate dielectric, the well region and source region are similar to those in FIG. 14 and thus will not be described. In FIG. 15, heavy body recess 1504 and $Si_{1-x}Ge_x$ 1560 are formed using similar technique (blanket deposition followed by selective etch) to those depicted by FIGS. 5A-5C. Alternatively, the $Si_{1-x}Ge_x$ may be formed using the selective deposition and selective etch technique depicted by FIGS. 6A-6B, in which case the $Si_{1-x}Ge_x$ would have a hill-shape profile similar to that shown in FIG. 6B. Thus, the same considerations, variations, features and advantages described above in reference to FIGS. 5-6 may also apply to the planar gate structures in FIGS. 15-16. Note that in FIGS. 14-16, the gate electrode may be covered by a protective layer (e.g., comprising dielectric) during the process steps for forming the $Si_{1-x}Ge_x$. Also, the same considerations and process steps for forming the top interconnect layer in FIGS. 1C, 5C and 7D apply to FIGS. 14, 15 and 16, respectively.

While the techniques depicted by FIGS. 1A-1C, FIG. 2, FIGS. 1A-1C, 2, 3A-3C, 4, 5A-5C, 6A-6B, 7A-7D and 10-16 are implemented in an n-channel FET, these techniques may also be implemented in a variety of other power devices. For example, these techniques may be implemented in an n-channel MOSFET in which case the n-type drift region (e.g., region 130 in FIGS. 1A-1C which may be an epitaxial layer) would extend over a highly doped n-type substrate (not shown). In a p-channel MOSFET variation, the conductivity type of all semiconductor regions would be reversed. As another example, the techniques may be implemented in an n-channel IGBT wherein the various regions would be of the same conductivity type as those of the n-channel MOSFET except that the substrate would be of p-type conductivity. In a p-channel IGBT, the conductivity type of all semiconductor regions would be reversed relative to the n-channel IGBT.

In yet other embodiments, the above trench gate MOSFETs and IGBTs of the no-shielded gate variety as, for example, in FIGS. 1-7, may be modified, using conventional techniques, to fill a bottom portion of each trench directly below the gate electrode with a thick bottom dielectric (TBD), such as oxide. This helps reduce the gate to drain capacitance Cgd of the transistor. In yet other embodiments, the gate trenches in all the above-mentioned FETs may be extended to terminate either in the drift region (as in the embodiments shown in the figures) or extend deeper and terminate in the substrate.

While the above embodiments and variations of the invention are described in the context of vertically conducting trench gate FETs, implementation of the techniques of the invention in laterally conducting FETs would be obvious to one skilled in the art in view of this disclosure. "Laterally conducting FETs" refer to those types of FETs with both the drain and source regions formed on the top-side of the die, and are intended to cover both trench gate and planar gate laterally conducting FET structures.

In accordance with other embodiments of the invention, in addition to the heavy body region, other regions of the FET, e.g., the gate electrode, may be formed to include SiGe. Techniques whereby various regions of a power FET are formed to include SiGe are described in application Ser. No. 11/245,995, titled "Bandgap Engineered MOS-Gated Power Transistors," filed Oct. 7, 2005, and application Ser. No. 11/469,456, titled "Power Trench MOSFETs Having SiGe/Si Channel structure," filed Aug. 31, 2006, both of which disclosures are incorporated herein by reference in their entirety for all purposes. One or more of the techniques for forming various regions to include SiGe as described in these two applications may be combined with the techniques for forming SiGe heavy body regions described herein to form power FETs with more superior characteristics.

While the above provides a complete description of various embodiments of the invention, many alternatives, modifications, and equivalents are possible. For this and other reasons, the above description should not be taken as limiting the scope of the invention, which is defined by the appended claims.

What is claimed is:

1. A field effect transistor (FET) comprising:
   a semiconductor region of a first conductivity type;
   a well region of a second conductivity type extending over the semiconductor region;
   a gate electrode adjacent to but insulated from the well region;
   a source region of the first conductivity type in the well region;
   a heavy body recess extending into and terminating within the well region adjacent the source region; and
   a heavy body material comprising germanium and having a lower energy gap than the well region, the heavy body material at least partially filling the heavy body recess.

2. The FET of claim 1 wherein the heavy body material comprises silicon germanium.

3. The FET of claim 1 wherein the heavy body material comprises boron doped silicon germanium.

4. The FET of claim 3 wherein the boron concentration is greater than $5 \times 10^{18}$ cm$^{-3}$.

5. The FET of claim 1 wherein the heavy body material comprises poly silicon germanium.

6. The FET of claim 1 wherein the heavy body material comprises epitaxial silicon germanium.

7. The FET of claim 1 wherein the heavy body material comprises $Si_{1-x}Ge_x$ where x>0.1.

8. The FET of claim 1 wherein the heavy body material comprises greater than or equal to about 10 percent germanium mole fraction.

9. The FET of claim 1 wherein the heavy body recess is substantially V-shaped, and the heavy body material comprises SiGe wherein a concentration of germanium in the SiGe decreases in a direction from the walls of the V-shaped heavy body recess toward a center of the heavy body recess.

10. The FET of claim 1 wherein a top surface of the heavy body material is below a top surface of the source region so that the heavy body material and the source region do not overlap.

11. The FET of claim 1 wherein the gate electrode is disposed in a trench extending into the well region and terminating in the semiconductor region.

12. The FET of claim 11 wherein a top surface of the heavy body material is substantially coplanar with a top surface of the source region.

13. The FET of claim 12 further comprising:
   a dielectric dome extending over the gate electrode and overlapping the source region; and
   an interconnect layer contacting the source region and the heavy body material, wherein the dielectric dome insulates the gate electrode from the interconnect layer.

14. The FET of claim 12 further comprising:
   a dielectric cap filling an upper portion of the trench over the gate electrode, the dielectric cap having a top surface substantially coplanar with a top surface of the source region; and
   an interconnect layer contacting the source region and the heavy body material, wherein the dielectric cap insulates the gate electrode from the interconnect layer.

15. The FET of claim 11 wherein the trench further includes:
a thick bottom dielectric filling a bottom portion of the trench beneath the gate electrode; and
a gate dielectric lining the trench sidewalls, the gate dielectric being thinner than the thick bottom dielectric.

16. The FET of claim 11 wherein the trench further includes:
a shield electrode filling a lower portion of the trench beneath the gate electrode, the shield electrode being insulated from the semiconductor region by a shield dielectric;
an inter-electrode dielectric layer extending between the shield electrode and the gate electrode; and
a gate dielectric extending along upper trench sidewalls, the gate dielectric being thinner than the shield dielectric.

17. The FET of claim 1 wherein the gate electrode laterally extends over but is insulted from the well region by a layer of gate dielectric.

18. A field effect transistor (FET) comprising:
a semiconductor region of a first conductivity type;
a well region of a second conductivity type extending over the semiconductor region;
a gate electrode adjacent to but insulated from the well region;
a source region of the first conductivity type in the well region;
a heavy body recess extending into and terminating within the well region adjacent the source region; and
a heavy body region extending in the well region along a bottom of the heavy body recess, wherein the heavy body region comprises a material that includes germanium and has a lower energy gap than that of the well region.

19. The FET of claim 18 further comprising an interconnect layer substantially filling the heavy body recess so as to electrically contact the heavy body region and the source region.

20. The FET of claim 18 wherein the heavy body region comprises silicon germanium.

21. The FET of claim 18 wherein the heavy body region comprises a boron doped silicon germanium.

22. The FET of claim 18 wherein the heavy body region comprises $Si_{1-x}Ge_x$ where x>0.1.

23. The FET of claim 18 wherein the heavy body region comprises greater than or equal to about 10 percent germanium mole fraction.

24. The FET of claim 18 wherein the gate electrode is disposed in a trench extending into the well region and terminating in the semiconductor region.

25. The FET of claim 24 further comprising:
a dielectric cap filling an upper portion of the trench over the gate electrode, the dielectric cap having a top surface substantially coplanar with a top surface of the source region; and
an interconnect layer contacting the source region and the heavy body region, wherein the dielectric cap insulates the gate electrode from the interconnect layer.

26. The FET of claim 24 wherein the trench further includes:
a thick bottom dielectric filling a bottom portion of the trench beneath the gate electrode; and
a gate dielectric lining the trench sidewalls, the gate dielectric being thinner than the thick bottom dielectric.

27. The FET of claim 24 wherein the trench further includes:
a shield dielectric lining lower sidewalls and bottom of the trench, the shield electrode being insulated from the semiconductor region by a shield dielectric;
an inter-electrode dielectric layer extending between the shield electrode and the gate electrode; and
a gate dielectric extending along upper trench sidewalls, the gate dielectric being thinner than the shield dielectric.

28. The FET of claim 18 wherein the gate electrode laterally extends over but is insulated from the well region by a layer of gate dielectric.

29. A field effect transistor (FET) comprising:
a semiconductor region of a first conductivity type;
a well region of a second conductivity type extending over the semiconductor region;
a gate electrode adjacent to but insulated from the well region;
a source region of the first conductivity type in the well region;
a heavy body region in electrical contact with the well region, wherein the heavy body region comprises a material that includes germanium and has a lower energy gap than the well region.

30. The FET of claim 29 wherein the heavy body region comprises silicon germanium.

31. The FET of claim 29 wherein the heavy body region comprises boron doped silicon germanium.

32. The FET of claim 29 wherein the heavy body region comprises $Si_{1-x}Ge_x$ where x>0.1.

33. The FET of claim 29 wherein the gate electrode is disposed in a trench extending into the well region and terminating in the semiconductor region.

34. The FET of claim 33 wherein the trench further includes:
a thick bottom dielectric filling a bottom portion of the trench beneath the gate electrode; and
a gate dielectric lining the trench sidewalls, the gate dielectric being thinner than the thick bottom dielectric.

35. The FET of claim 33 wherein the trench further includes:
a shield electrode filling a lower portion of the trench beneath the gate electrode, the shield electrode being insulated from the semiconductor region by a shield dielectric;
an inter-electrode dielectric layer extending between the shield electrode and the gate electrode; and
a gate dielectric extending along upper trench sidewalls, the gate dielectric being thinner than the shield dielectric.

36. The FET of claim 29 wherein the gate electrode laterally extends over but is insulated from the well region by a layer of gate dielectric.

37. The FET of claim 29 further comprising:
a heavy body recess extending into and terminating within the well region adjacent the source region, the heavy body region extending along a bottom of the heavy body recess; and
an interconnect layer extending into the heavy body recess to electrically contact the heavy body region and the source region.

38. The FET of claim 29 further comprising a heavy body recess extending into and terminating within the well region adjacent the source region, wherein the heavy body region at least partially fills the heavy body recess.

* * * * *